United States Patent [19]

Gillery

[11] 4,201,649

[45] May 6, 1980

[54] LOW RESISTANCE INDIUM OXIDE COATINGS

[75] Inventor: F. Howard Gillery, Allison Park, Pa.

[73] Assignee: PPG Industries, Inc., Pittsburgh, Pa.

[21] Appl. No.: 964,765

[22] Filed: Nov. 29, 1978

[51] Int. Cl.$^2$ ............................................. C23C 15/00
[52] U.S. Cl. ............................. 204/192 P; 204/192 R
[58] Field of Search ...................... 204/192 P, 192 SP

[56] References Cited

U.S. PATENT DOCUMENTS

| | | | |
|---|---|---|---|
| 2,825,687 | 3/1958 | Preston et al. | 204/192 |
| 3,369,989 | 2/1968 | Kay et al. | 204/298 |
| 3,655,545 | 4/1972 | Gillery et al. | 204/192 |
| 4,094,763 | 6/1978 | Gillery et al. | 204/192 P |
| 4,113,599 | 9/1978 | Gillery | 204/192 P |

OTHER PUBLICATIONS

J. C. C. Fan and F. J. Bachner, Properties of Sn-doped In$_2$O$_3$ Films Prepared by RF Sputtering; J. Electrochem. Soc., vol. 122, No. 12, (Dec. 1975), pp. 1719–1725.

J. A. Thornton and Virgle L. Hedgcoth, Transparent Conductive Sn-doped Indium Oxide Coatings . . . ; J. Vac. Sci. Technol., vol. 13, No. 1 (Jan./Feb. 1976), pp. 117–121.

D. B. Fraser and H. D. Cook, Film Deposition with the Sputter Gun, J. Vac. Sci. Technol., vol. 14, No. 1 (Jan.-/Feb. 1977), pp. 147–151.

*Primary Examiner*—John H. Mack
*Assistant Examiner*—William Leader
*Attorney, Agent, or Firm*—Donna L. Seidel

[57] ABSTRACT

A method is disclosed for making low resistance thin indium oxide films by first depositing a thin primer layer of indium oxide at low temperature before heating to deposit the bulk of the conductive layer of indium oxide by cathode sputtering.

4 Claims, No Drawings

LOW RESISTANCE INDIUM OXIDE COATINGS

FIELD OF THE INVENTION

The present invention relates generally to the art of cathode sputtering and particularly to the art of cathode sputtering low resistance indium oxide coatings.

THE PRIOR ART

Conductive indium oxide films can be applied by vacuum evaporation techniques. These techniques were developed as lower temperature coating processes to replace pyrolytic techniques in which it was necessary to heat the substrate to very high temperatures. Low temperature vacuum evaporation in an oxygen atmosphere is done slowly to insure that the metal oxidizes. The resultant films often are subsequently heated to improve their conductivity.

Indium oxide films can also be applied by cathode sputtering techniques. Some techniques involve oxidizing the cathode and sputtering the oxide. In U.S. Pat. No. 2,825,687, Preston discloses a coating technique whereby the metal is sputtered in an atmosphere containing only a trace of oxygen. The colored and/or opaque film is subsequently heated in air to obtain the desired conductivity and transparency properties. In U.S. Pat. No. 3,655,545, Gillery and Presseau disclose cathode sputtering in a low pressure atmosphere containing sufficient oxygen to assure the formation of a colorless, transparent film and then heating the film in an oxygen-deficient atmosphere to increase the conductivity.

The heat generated by cathode sputtering is difficult to regulate and therefore can result in nonuniform coating thickness and resistance. In U.S. Pat. No. 3,369,989, Kay et al disclose apparatus for controlling the temperature throughout a small substrate within one degree of 300° C. However, it is disclosed by Gillery et al in U.S. Pat. No. 4,094,763 that it is not necessary to maintain the substrate at a constant temperature throughout the cathode sputtering operation provided the substrate is heated to about 400° F. before the cathode sputtering commences, the substrate temperature varies during sputtering between 400° F. and a temperature below that at which the substrate is detrimentally affected, and the substrate is cooled to below the temperature at which sputtering commenced before the substrate is removed from the low pressure atmosphere in which sputtering was accomplished.

SUMMARY OF THE INVENTION

It has been discovered that for very thin films of indium and/or tin oxide the resistance and thermal stability of sputtered oxide coatings are inferior to the resistance and thermal stability of the best low temperature evaporated oxide coatings. It is now proposed that during low temperature vacuum evaporation at high deposition rates, small crystals are deposited so that the film becomes continuous at small thicknesses whereas during cathode sputtering at low deposition rates, the high substrate temperature results in the deposition of large crystals which are discontinuous for the first few hundred Angstroms thickness. This difference between the two procedures is insignificant when relatively thick films are produced because the non-contacting, large crystal layer of the sputtered film is a small fraction of the total film. However, for thin conductive films, this difference is significant, and to obtain optimum properties for sputtered films, the discontinuous layer must be minimized.

According to the method of the present invention, the conductivity and thermal stability of sputtered indium and/or tin oxide coatings are improved by cathode sputtering the metal oxide by conventional techniques onto a very thin primer layer of the metal oxide deposited on the substrate at a temperature substantially lower than conventional sputtering temperatures.

DESCRIPTION OF THE PREFERRED EMBODIMENT

Cathode sputtering is preferably conducted in a low pressure atmosphere of an inert gas and oxygen. A coating chamber is evacuated to a pressure less than about $10^{-1}$ Torr, preferably less than $10^{-4}$ Torr. A gaseous mixture, preferably comprising from about 0.5 to 15 percent oxygen in argon, is introduced into the chamber wherein the pressure is maintained between about 5 and 50 millitorr.

A voltage is applied to a cathode from a high voltage source, preferably 4000–5000 Volts D.C. or more. The cathode comprises a metal having an atomic number from 48 to 51, preferably indium, and more preferably indium combined with 1 to 20 percent tin. As a glow discharge commences, the substrate to be coated is maintained at a temperature substantially below typical cathode sputtering temperatures used for the deposition of electroconductive metal oxide coatings as disclosed in U.S. Pat. No. 4,094,763. The substrate is maintained at a temperature below about 200° F. (about 94° C.) and preferably at ambient temperature. Although no additional heat is applied, the temperature of the substrate will increase during the course of cathode sputtering unless cooling is effected to maintain the substrate at its initial temperature. Cathode sputtering of metal oxide onto the relatively cool substrate surface is continued until a thin primer layer is established at least about 20 Angstroms thick, preferably about 30 Angstroms thick, or sufficient to decrease the luminous transmittance of a clear glass substrate from 90.9 to 90.8 percent.

Following the deposition of the primer layer, the temperature of the substrate is increased to typical cathode sputtering temperatures such as about 400° F. (about 204° C.) or more for the deposition of a conductive coating which is accomplished according to conventional techniques, preferably the technique disclosed in U.S. Pat. No. 4,094,763, which disclosure is incorporated herein by reference. The total coating thickness is typically less than 800 Angstroms, preferably from about 200 to 800 Angstroms.

Conductive indium and/or tin oxide coatings deposited according to the method of the present invention have lower initial resistances than coatings of the same thickness deposited by conventional cathode sputtering techniques. In addition, coatings prepared according to the present invention have better thermal stability, i.e., the resistance increases less upon exposure to high temperature conditions, compared with coatings deposited by conventional techniques. The present invention will be further understood from the descriptions of specific examples which follow.

EXAMPLE I

A coating chamber is evacuated and an atmosphere comprising 3 percent oxygen in argon at a pressure of $3 \times 10^{-2}$ Torr is established. A cathode comprising 90 percent indium and 10 percent tin is subjected to 4000 volts and 270 milliamperes current. Cathode sputtering for 45 seconds onto a glass substrate ⅛ inch (3 millimeters) thick which is at a temperature of 800° F. results in the deposition of a typical indium/tin oxide coating about 300 Angstroms thick. The coating has an initial resistance of 220 ohms per square. Upon heating the coated substrate for 5 minutes at 520° C., the resistance increases to 1600 ohms per square.

EXAMPLE II

A coating chamber is evacuated and an atmosphere comprising 10 percent oxygen in argon at a pressure of $3 \times 10^{-2}$ Torr is established. A cathode comprising 90 percent indium and 10 percent tin is subjected to 4000 volts and 270 milliamperes current. Cathode sputtering for 10 seconds onto a glass substrate ⅛ inch (3 millimeters) thick at ambient temperature (about 80° F.) results in the deposition of a thin primer layer of indium/tin oxide about 30 Angstroms thick. The primed substrate is then coated with indium/tin oxide as in Example I to a final thickness of about 300 Angstroms. The coating has an initial resistance of 120 ohms per square. Upon heating the coated substrate for 5 minutes at 520° C., the resistance increases to only 500 ohms per square.

The above examples are offered to illustrate the present invention and are not intended to limit its scope. Various suitable temperature, pressure, electrical and atmospheric conditions for cathode sputtering are included as well as suitable metals other than indium, and suitable substrates other than glass, such as flexible and rigid plastics. Also, the primer layer of oxide could be applied by other means such as low temperature vacuum evaporation so long as it is a continuous layer. In addition, the primer layer could be applied to portions of the substrate rather than the entire surface to be coated in order to provide a coated substrate with areas of different conductivity. The scope of the present invention is defined by the following claims.

I claim:

1. In a method for depositing a transparent electroconductive coating consisting essentially of the oxide of at least one metal having an atomic number between 48 and 51 comprising the steps of supporting a substate in an atmosphere comprising an inert gas and sufficient oxygen to effect oxide formation at a pressure of less than about $10^{-1}$ Torr, heating the substrate, and cathode sputtering a metallic target to deposit said oxide onto said substrate until a coating of desired thickness is formed, the improvement which comprises carrying out the cathode sputtering in at least two steps at substantially different temperatures whereby a. a thin layer of oxide constituting the minor portion of the final oxide layer is deposited at a temperature of $T_1$;
   b. the deposition is interrupted while the substrate is heated; and
   c. subsequently, the major portion of the final oxide layer is deposited at a temperature $T_2$ wherein $T_1$ which is less than about 200° F. (about 94° C.) is substantially lower than $T_2$ which is at least about 400° F. (about 204° C.).

2. The method according to claim 1, wherein said oxide is a mixture comprising from about 80 to 99 percent indium oxide and from about 1 to 20 percent tin oxide.

3. The method according to claim 2, wherein the film deposited prior to heating said substrate is at least about 20 Angstroms thick and the total thickness of the sputtered coating is less than 800 Angstroms.

4. The method according to claim 3, wherein the film deposited prior to heating said substrate is at least about 30 Angstroms thick and the total thickness of the sputtered coating is from about 200 to 800 Angstroms.

* * * * *